United States Patent
Yoda

(10) Patent No.: US 7,065,542 B2
(45) Date of Patent: Jun. 20, 2006

(54) CALCULATING APPARATUS AND ITS METHOD

(75) Inventor: Kiwamu Yoda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 692 days.

(21) Appl. No.: 10/166,178

(22) Filed: Jun. 11, 2002

(65) Prior Publication Data

US 2002/0194231 A1    Dec. 19, 2002

(30) Foreign Application Priority Data

Jun. 13, 2001   (JP) .............. 2001-178777

(51) Int. Cl.
*G06F 7/38* (2006.01)
(52) U.S. Cl. ...................... 708/290; 708/446
(58) Field of Classification Search ............ 708/209, 708/446
See application file for complete search history.

(56) References Cited

U.S. PATENT DOCUMENTS

| | | | | |
|---|---|---|---|---|
| 4,511,989 A | * | 4/1985 | Sakamoto | 708/290 |
| 5,432,892 A | * | 7/1995 | Hafner et al. | 345/591 |
| 5,511,012 A | * | 4/1996 | Deville | 702/109 |
| 5,748,195 A | * | 5/1998 | Nin | 345/604 |

* cited by examiner

*Primary Examiner*—Chuong D. Ngo
(74) *Attorney, Agent, or Firm*—Rabin & Berdo, PC

(57) ABSTRACT

A calculating apparatus comprises a memory and a calculating section. The memory is stored with table data for referencing a value of a variable x by using a value of a variable y and a value of a solution z. The calculating section inputs x_in and y_in, reads two values y_a and y_b corresponding to y_in from the memory, reads two values x_aa and x_ab corresponding to x_in from the memory in a line corresponding to y_a, reads two values x_ba and x_bb corresponding to x_in from the memory in a line corresponding to y_b, and calculates a solution z corresponding to x_in and y_in in an interpolation by using x_in and y_in and the read values y_a, y_b, x_aa, x_ab, x_ba, and x_bb.

3 Claims, 10 Drawing Sheets

EQUATION(5)  $X = \dfrac{(Z+273.15)^4 - (Y+273.15)^4}{C}$

| | | THERMOCOUPLE INPUT TEMPERATURE Z[°C] | | | | | | | | | |
|---|---|---|---|---|---|---|---|---|---|---|---|
| THERMOCOUPLE OUTPUT X[V] | | 60 | 70 | 80 | 90 | 100 | 110 | 120 | 130 | 140 | 150 |
| AMBIENT TEMPERATURE Y[°C] | -20 | 0.08 | 0.10 | 0.11 | 0.13 | 0.15 | 0.17 | 0.20 | 0.22 | 0.25 | 0.28 |
| | -10 | 0.08 | 0.09 | 0.11 | 0.13 | 0.15 | 0.17 | 0.19 | 0.22 | 0.24 | 0.27 |
| | 0 | 0.07 | 0.08 | 0.10 | 0.12 | 0.14 | 0.16 | 0.18 | 0.21 | 0.24 | 0.26 |
| | 10 | 0.06 | 0.07 | 0.09 | 0.11 | 0.13 | 0.15 | 0.17 | 0.20 | 0.23 | 0.26 |
| | 20 | 0.05 | 0.06 | 0.08 | 0.10 | 0.12 | 0.14 | 0.17 | 0.19 | 0.22 | 0.25 |
| | 30 | 0.04 | 0.05 | 0.07 | 0.09 | 0.11 | 0.13 | 0.15 | 0.18 | 0.21 | 0.24 |
| | 40 | 0.03 | 0.04 | 0.06 | 0.08 | 0.10 | 0.12 | 0.14 | 0.17 | 0.20 | 0.22 |
| | 50 | 0.01 | 0.03 | 0.05 | 0.06 | 0.08 | 0.11 | 0.13 | 0.16 | 0.18 | 0.21 |
| | 60 | 0.00 | 0.02 | 0.03 | 0.05 | 0.07 | 0.09 | 0.12 | 0.14 | 0.17 | 0.20 |
| | 70 | -0.02 | 0.00 | 0.02 | 0.04 | 0.06 | 0.08 | 0.10 | 0.13 | 0.15 | 0.18 |
| | 80 | -0.03 | -0.02 | 0.00 | 0.02 | 0.04 | 0.06 | 0.08 | 0.11 | 0.14 | 0.17 |
| | 90 | -0.05 | -0.04 | -0.02 | 0.00 | 0.02 | 0.04 | 0.06 | 0.09 | 0.12 | 0.15 |
| | 100 | -0.07 | -0.06 | -0.04 | -0.02 | 0.00 | 0.02 | 0.05 | 0.07 | 0.10 | 0.13 |
| | 110 | -0.09 | -0.08 | -0.06 | -0.04 | -0.02 | 0.00 | 0.02 | 0.05 | 0.08 | 0.11 |
| | 120 | -0.12 | -0.10 | -0.08 | -0.06 | -0.05 | -0.02 | 0.00 | 0.03 | 0.05 | 0.08 |
| | 130 | -0.14 | -0.13 | -0.10 | -0.09 | -0.07 | -0.05 | -0.03 | 0.00 | 0.03 | 0.06 |
| | 140 | -0.17 | -0.15 | -0.14 | -0.12 | -0.10 | -0.08 | -0.05 | -0.03 | 0.00 | 0.03 |
| | 150 | -0.20 | -0.18 | -0.17 | -0.15 | -0.13 | -0.11 | -0.08 | -0.06 | -0.03 | 0.00 |
| | 160 | -0.23 | -0.21 | -0.20 | -0.18 | -0.16 | -0.14 | -0.11 | -0.09 | -0.06 | -0.03 |

NOTE THAT THE CONSTANT C IS ASSUMED TO BE 1.0E+11.

Fig.2

THE TABLE DENSITY IS HIGH ONLY IN A REGION REQUIRING A HIGH PRECISION.

THERMOCOUPLE INPUT TEMPERATURE Z[°C]

| THERMOCOUPLE OUTPUT X[V] / AMBIENT TEMPERATURE Y[°C] | 60 | 80 | 100 | 104 | 108 | 112 | 116 | 120 | 140 | 150 |
|---|---|---|---|---|---|---|---|---|---|---|
| -20 | 0.08 | 0.11 | 0.15 | 0.16 | 0.17 | 0.18 | 0.19 | 0.20 | 0.25 | 0.31 |
| -5 | 0.07 | 0.10 | 0.14 | 0.15 | 0.16 | 0.17 | 0.18 | 0.19 | 0.24 | 0.30 |
| 10 | 0.06 | 0.09 | 0.13 | 0.14 | 0.15 | 0.16 | 0.17 | 0.17 | 0.23 | 0.29 |
| 25 | 0.04 | 0.08 | 1.11 | 0.12 | 0.13 | 0.14 | 0.15 | 0.16 | 0.21 | 0.27 |
| 40 | 0.03 | 0.06 | 0.10 | 0.11 | 0.11 | 0.12 | 0.13 | 0.14 | 0.20 | 0.26 |
| 45 | 0.02 | 0.05 | 0.09 | 0.10 | 0.11 | 0.12 | 0.13 | 0.14 | 0.19 | 0.25 |
| 50 | 0.01 | 0.05 | 0.08 | 0.09 | 0.10 | 0.11 | 0.12 | 0.13 | 0.18 | 0.24 |
| 55 | 0.01 | 0.04 | 0.08 | 0.09 | 0.10 | 0.10 | 0.11 | 0.12 | 0.18 | 0.24 |
| 60 | 0 | 0.03 | 0.07 | 0.08 | 0.09 | 0.10 | 0.11 | 0.12 | 0.17 | 0.23 |
| 65 | -0.01 | 0.02 | 0.06 | 0.07 | 0.08 | 0.09 | 0.10 | 0.11 | 0.16 | 0.22 |
| 70 | -0.02 | 0.02 | 0.06 | 0.06 | 0.07 | 0.08 | 0.09 | 0.10 | 0.15 | 0.21 |
| 75 | -0.02 | 0.01 | 0.05 | 0.06 | 0.06 | 0.07 | 0.08 | 0.09 | 0.14 | 0.21 |
| 80 | -0.03 | 0.00 | 0.04 | 0.05 | 0.06 | 0.06 | 0.07 | 0.08 | 0.14 | 0.20 |
| 85 | -0.04 | -0.01 | 0.03 | 0.04 | 0.05 | 0.06 | 0.06 | 0.07 | 0.13 | 0.19 |
| 100 | -0.07 | -0.04 | 0.00 | 0.01 | 0.02 | 0.03 | 0.04 | 0.05 | 0.10 | 0.16 |
| 115 | -0.10 | -0.07 | -0.03 | -0.02 | -0.02 | -0.01 | 0.00 | 0.01 | 0.06 | 0.13 |
| 130 | -0.14 | -0.11 | -0.07 | -0.06 | -0.05 | -0.04 | -0.03 | -0.03 | 0.03 | 0.09 |
| 145 | -0.18 | -0.15 | -0.11 | -0.10 | -0.09 | -0.09 | -0.08 | -0.07 | -0.01 | 0.05 |
| 160 | -0.23 | -0.20 | -0.16 | -0.15 | -0.14 | -0.13 | -0.12 | -0.11 | -0.06 | 0.00 |

REGION REQUIRING HIGH PRECISION

NOTE THAT THE CONSTANT C IS ASSUMED TO BE 1.0E+11.

Fig.6

EQUATION(1)   $Z = \sqrt{CX+(Y+273.15)^4} - 273.15$

THERMOCOUPLE OUTPUT X[V]

| THERMOCOUPLE INPUT TEMPERATURE Z [°C] | -0.03 | -0.02 | -0.01 | 0 | 0.01 | 0.02 | 0.03 | 0.04 | 0.05 | 0.06 | 0.07 | 0.08 | 0.09 |
|---|---|---|---|---|---|---|---|---|---|---|---|---|---|
| -20 | -90.75 | -56.91 | -37.06 | -20.00 | -5.83 | 6.40 | 17.20 | 26.91 | 35.77 | 43.92 | 51.49 | 8.56 | 65.21 |
| -10 | -67.31 | -43.21 | -24.94 | -10.00 | 2.76 | 13.96 | 23.99 | 33.09 | 41.45 | 49.19 | 56.40 | 63.18 | 69.56 |
| 0 | -48.06 | -28.77 | -13.19 | 0.00 | 11.52 | 21.79 | 31.08 | 39.60 | 47.47 | 54.80 | 61.67 | 68.14 | 74.26 |
| 10 | -31.18 | -15.19 | -1.72 | 10.00 | 20.42 | 29.84 | 38.45 | 46.41 | 53.81 | 60.74 | 67.26 | 73.43 | 79.28 |
| 20 | -15.82 | -2.26 | 9.53 | 20.00 | 29.46 | 38.10 | 46.08 | 53.50 | 60.45 | 66.99 | 73.17 | 79.04 | 84.63 |
| 30 | -1.50 | 10.20 | 20.60 | 30.00 | 38.60 | 46.54 | 53.93 | 60.86 | 67.37 | 73.53 | 79.38 | 84.96 | 90.28 |
| 40 | 12.05 | 22.27 | 31.52 | 40.00 | 47.84 | 55.15 | 62.00 | 68.45 | 74.55 | 80.35 | 85.88 | 91.17 | 96.23 |
| 50 | 25.03 | 34.04 | 42.32 | 50.00 | 57.17 | 63.89 | 70.24 | 76.26 | 81.98 | 87.43 | 92.65 | 97.65 | 102.46 |
| 60 | 37.55 | 45.57 | 53.02 | 60.00 | 65.56 | 72.77 | 78.66 | 84.26 | 89.62 | 94.74 | 99.67 | 104.40 | 108.96 |
| 70 | 49.71 | 56.89 | 63.64 | 70.00 | 76.03 | 81.76 | 87.22 | 92.45 | 97.46 | 102.28 | 106.91 | 111.39 | 115.71 |
| 80 | 61.58 | 68.05 | 74.18 | 80.00 | 85.54 | 90.84 | 95.92 | 100.80 | 105.49 | 110.01 | 114.38 | 118.61 | 122.70 |
| 90 | 73.21 | 79.08 | 84.66 | 90.00 | 95.11 | 100.02 | 104.74 | 109.29 | 113.68 | 117.93 | 122.04 | 126.03 | 129.91 |
| 100 | 84.64 | 89.98 | 95.09 | 100.00 | 104.72 | 109.27 | 113.67 | 117.91 | 122.03 | 126.02 | 129.89 | 133.66 | 137.32 |
| 110 | 95.91 | 100.78 | 105.48 | 110.00 | 114.37 | 118.60 | 122.69 | 126.66 | 130.52 | 134.26 | 137.91 | 141.46 | 144.93 |
| 120 | 107.03 | 111.50 | 115.82 | 120.00 | 124.05 | 127.98 | 131.80 | 135.51 | 139.13 | 142.65 | 146.09 | 149.44 | 152.71 |
| 130 | 118.03 | 122.14 | 126.13 | 130.00 | 133.76 | 137.42 | 140.99 | 144.46 | 147.86 | 151.17 | 154.40 | 157.57 | 160.66 |
| 140 | 128.93 | 132.72 | 136.41 | 140.00 | 143.50 | 146.91 | 150.25 | 153.50 | 156.69 | 159.80 | 162.85 | 165.83 | 168.76 |
| 150 | 139.73 | 143.24 | 146.66 | 150.00 | 153.26 | 156.45 | 159.59 | 162.62 | 165.61 | 168.54 | 171.42 | 174.23 | 177.00 |
| 160 | 150.46 | 153.71 | 156.89 | 160.00 | 163.04 | 166.03 | 168.95 | 171.61 | 174.62 | 177.38 | 180.09 | 182.75 | 185.37 |

AMBIENT TEMPERATURE Y [°C]

NOTE THAT THE CONSTANT C IS ASSUMED TO BE 1.0E+11.

Fig.8

EQUATION(1) $Z = \sqrt[4]{CX+(Y+273.15)^4} - 273.15$

| THERMOCOUPLE INPUT TEMPERATURE Z[°C] | | THERMOCOUPLE OUTPUT X[V] | | | | | | | | | | | | |
|---|---|---|---|---|---|---|---|---|---|---|---|---|---|
| | | -0.03 | -0.02 | -0.01 | 0 | 0.01 | 0.02 | 0.03 | 0.04 | 0.05 | 0.06 | 0.07 | 0.08 | 0.09 |
| AMBIENT TEMPERATURE Y[°C] | -20 | -90.75 | -56.91 | -37.06 | -20.00 | -5.83 | 6.40 | 17.20 | 26.91 | 35.77 | 43.92 | 51.49 | 8.56 | 65.21 |
| | -10 | -67.31 | -43.21 | -24.94 | -10.00 | 2.76 | 13.96 | 23.99 | 33.09 | 41.45 | 49.19 | 56.40 | 63.18 | 69.56 |
| | 0 | -48.06 | -28.77 | -13.19 | 0.00 | 11.52 | 21.79 | 31.08 | 39.60 | 47.47 | 54.80 | 61.67 | 68.14 | 74.26 |
| | 10 | -31.18 | -15.19 | -1.72 | 10.00 | 20.42 | 29.84 | 38.45 | 46.41 | 53.81 | 60.74 | 67.26 | 73.43 | 79.28 |
| | 20 | -15.82 | -2.26 | 9.53 | 20.00 | 29.46 | 38.10 | 46.08 | 53.50 | 60.45 | 66.99 | 73.17 | 79.04 | 84.63 |
| | 30 | -1.50 | 10.20 | 20.60 | 30.00 | 38.60 | 46.54 | 53.93 | 60.86 | 67.37 | 73.53 | 79.38 | 84.96 | 90.28 |
| | 40 | 12.05 | 22.27 | 31.52 | 40.00 | 47.84 | 55.15 | 62.00 | 68.45 | 74.55 | 80.35 | 85.88 | 91.17 | 96.23 |
| | 50 | 25.03 | 34.04 | 42.32 | 50.00 | 57.17 | 63.89 | 70.24 | 76.26 | 81.98 | 87.43 | 92.65 | 97.65 | 102.46 |
| | 60 | 37.55 | 45.57 | 53.02 | 60.00 | 65.56 | 72.77 | 78.66 | 84.26 | 89.62 | 94.74 | 99.67 | 104.40 | 108.96 |
| | 70 | 49.71 | 56.89 | 63.64 | 70.00 | 76.03 | 81.76 | 87.22 | 92.45 | 97.46 | 102.28 | 106.91 | 111.39 | 115.71 |
| | 80 | 61.58 | 68.05 | 74.18 | 80.00 | 85.54 | 90.84 | 95.92 | 100.80 | 105.49 | 110.01 | 114.38 | 118.61 | 122.70 |
| | 90 | 73.21 | 79.08 | 84.66 | 90.00 | 95.11 | 100.02 | 104.74 | 109.29 | 113.68 | 117.93 | 122.04 | 126.03 | 129.91 |
| | 100 | 84.64 | 89.98 | 95.09 | 100.00 | 104.72 | 109.27 | 113.67 | 117.91 | 122.03 | 126.02 | 129.89 | 133.66 | 137.32 |
| | 110 | 95.91 | 100.78 | 105.48 | 110.00 | 114.37 | 118.60 | 122.69 | 126.66 | 130.52 | 134.26 | 137.91 | 141.46 | 144.93 |
| | 120 | 107.03 | 111.50 | 115.82 | 120.00 | 124.05 | 127.98 | 131.80 | 135.51 | 139.13 | 142.65 | 146.09 | 149.44 | 152.71 |
| | 130 | 118.03 | 122.14 | 126.13 | 130.00 | 133.76 | 137.42 | 140.99 | 144.46 | 147.86 | 151.17 | 154.40 | 157.57 | 160.66 |
| | 140 | 128.93 | 132.72 | 136.41 | 140.00 | 143.50 | 146.91 | 150.25 | 153.50 | 156.69 | 159.80 | | | |
| | 150 | 139.73 | 143.24 | | | | 156.45 | 159.59 | 162.62 | 165.61 | 168.54 | | | |
| | 160 | 150.46 | 153.71 | | | | 166.03 | 168.95 | 171.61 | 174.62 | 177.38 | | | |

Z1 = 104.74 (X1 = 0.03, Y1 = 90)
Z2 = 109.29 (X2 = 0.04, Y1 = 90)
Z3 = 113.97 (X1 = 0.03, Y2 = 100)
Z3 = 117.91 (X2 = 0.04, Y2 = 100)

NOTE THAT THE CONSTANT C IS ASSUMED TO BE 1.0E+11.

Fig.9

EQUATION(1) $Z = \sqrt[4]{CX+(Y+273.15)^4} - 273.15$

| THERMOCOUPLE INPUT TEMPERATURE Z [°C] | AMBIENT TEMPERATURE Y [°C] | THERMOCOUPLE OUTPUT X[V] | | | | | | | | | | | | |
|---|---|---|---|---|---|---|---|---|---|---|---|---|---|
| | | -0.03 | -0.02 | -0.01 | 0 | 0.01 | 0.02 | 0.03 | 0.04 | 0.05 | 0.06 | 0.07 | 0.08 | 0.09 |
| | -20 | -90.75 | -56.91 | -37.06 | -20.00 | -5.83 | 6.40 | 17.20 | 26.91 | 35.77 | 43.92 | 51.49 | 8.56 | 0.09 |
| | -10 | -67.31 | -43.21 | -24.94 | -10.00 | 2.76 | 13.96 | 23.99 | 33.09 | 41.45 | 49.19 | 56.40 | 63.18 | 65.21 |
| | 0 | -48.06 | -28.77 | -13.19 | 0.00 | 11.52 | 21.79 | 31.08 | 39.60 | 47.47 | 54.80 | 61.67 | 68.14 | 69.56 |
| | 10 | -31.18 | -15.19 | -1.72 | 10.00 | 20.42 | 29.84 | 38.45 | 46.41 | 53.81 | 60.74 | 67.26 | 73.43 | 74.26 |
| | 20 | -15.82 | -2.26 | 9.53 | 20.00 | 29.46 | 38.10 | 46.08 | 53.50 | 60.45 | 66.99 | 73.17 | 79.04 | 79.28 |
| | 30 | -1.50 | 10.20 | 20.60 | 30.00 | 38.60 | 46.54 | 53.93 | 60.86 | 67.37 | 73.53 | 79.38 | 84.96 | 84.63 |
| | 40 | 12.05 | 22.27 | 31.52 | 40.00 | 47.84 | 55.15 | 62.00 | 68.45 | 74.55 | 80.35 | 85.88 | 91.17 | 90.28 |
| | 50 | 25.03 | 34.04 | 42.32 | 50.00 | 57.17 | 63.89 | 70.24 | 76.26 | 81.98 | 87.43 | 92.65 | 97.65 | 96.23 |
| | 60 | 37.55 | 45.57 | 53.02 | 60.00 | 65.56 | 72.77 | 78.66 | 84.26 | 89.62 | 94.74 | 99.67 | 104.40 | 102.46 |
| | 70 | 49.71 | 56.89 | 63.64 | 70.00 | 76.03 | 81.76 | 87.22 | 92.45 | 97.46 | 102.28 | 106.91 | 111.39 | 108.96 |
| | 80 | 61.58 | 68.05 | 74.18 | 80.00 | 85.54 | 90.84 | 95.92 | 100.80 | 105.49 | 110.01 | 114.38 | 118.61 | 115.71 |
| | 90 | 73.21 | 79.08 | 84.66 | 90.00 | 95.11 | 100.02 | 104.74 | 109.29 | 113.68 | 117.93 | 122.04 | 126.03 | 122.70 |
| | 100 | 84.64 | 89.98 | 95.09 | 100.00 | 104.72 | 109.27 | 113.67 | 117.91 | 122.03 | 126.02 | 129.89 | 133.66 | 129.91 |
| | 110 | 95.91 | 100.78 | 105.48 | 110.00 | 114.37 | 118.60 | 122.69 | 126.66 | 130.52 | 134.26 | 137.91 | 141.46 | 137.32 |
| | 120 | 107.03 | 111.50 | 115.82 | 120.00 | 124.05 | 127.98 | 131.80 | 135.51 | 139.13 | 142.65 | 146.09 | 149.44 | 144.93 |
| | 130 | 118.03 | 122.14 | 126.13 | 130.00 | 133.76 | 137.42 | 140.99 | 144.46 | 147.86 | 151.17 | 154.40 | 157.57 | 152.71 |
| | 140 | 128.93 | 132.72 | 136.41 | 140.00 | 143.50 | 146.91 | 150.25 | 153.50 | 156.69 | 159.80 | 162.85 | 165.83 | 160.66 |
| | 150 | 139.73 | 143.24 | 146.66 | 150.00 | 153.26 | 156.45 | 159.59 | 162.62 | 165.61 | 168.54 | 171.42 | 174.23 | 168.76 |
| | 160 | 150.46 | 153.71 | 156.89 | 160.00 | 163.04 | 166.03 | 168.95 | 171.61 | 174.62 | 177.38 | 180.09 | 182.75 | 185.37 |

NOTE THAT THE CONSTANT C IS ASSUMED TO BE 1.0E+11.

Fig.10

CALCULATING APPARATUS AND ITS METHOD

BACKGROUND OF THE INVENTION

1. Field of the Invention

The present invention relates to a calculating apparatus, a calculating method, and their related technologies, and more particularly to a calculating apparatus, a calculating method, and their related technologies for calculating a thermocouple input temperature from a thermocouple output potential and an ambient temperature.

This application is a counterpart of Japanese patent application, Ser. No. 178777/2001, filed Jun. 13, 2001, the subject matter of which is incorporated herein by reference.

2. Related Background Art

For a calculating apparatus, which is hard to update a program because of a low calculational capacity like a general built-in micro controller, when performing a complicated calculation with two or more input variables, there has been a conventional art such as a calculating method of storing data at previously calculated sample points as data in a grid table format (hereinafter, referred to as table data) in an EEPROM (electrically erasable and programmable ROM) or a rewritable memory element such as a flash memory (hereinafter, referred to as a memory) and then calculating a result from the sample point data by using the input variables.

Hereinafter, the conventional art will now be described. The calculating method described below is carried out by a calculating apparatus including a memory in which the table data is stored and a calculating section. The calculating section includes a ROM (read only memory) in which the calculating method is stored. The ROM is stored with equations (1) to (4) described later and a calculating procedure using them.

1. First, the table data is generated. The table data is generated on the basis of a basic equation for calculating a result from a plurality of input variables. The input variables are given discrete values. The table data can be either generated inside the calculating apparatus or generated externally and then input to the calculating apparatus. The following equation (1) is shown here as an example of the basic equation. The equation (1) is a quartic expression for evaluating z to a thermocouple input temperature [° C.] from x to a thermocouple output [V] and y to an ambient temperature [° C.], which are assumed to be input variables.

[Eq. 1]

$$z = \sqrt[4]{(cx+(y+273.15)^4)} - 273.15 \quad (1)$$

where the constant c is assumed to be $1.0 \times 10^{11}$.

The table data shown in FIG. 8 is obtained by giving discrete values to the thermocouple output x and the ambient temperature y in the equation (1) and calculating the value of the thermocouple input temperature z. The thermocouple output x is given a discrete value delimited by 0.01V within a range of −0.03V to 0.09 V and the ambient temperature y is given a discrete value delimited by 10° C. within a range of −20° C. to 160° C.

2. Then, the generated table data is stored in a rewritable memory. The calculating procedure (described later) is stored in the ROM of the computer.

3. A result of the calculation is obtained from the input variables in the following calculating procedure:

(1) Extracting four calculation results existing at the closest position to a position on the calculation result table specified by the given input variables (2) Calculating a result from the four calculation results extracted in (1) and the given input variables It is assumed that input variables x=0.036 [V] and y=94 [° C.] are given here as an example. As shown in FIG. 9, four calculation results (z1, z2, z3, and z4) are obtained, existing at the closest position to a position specified by (x, y). Then, the result z is calculated from the z1, z2, z3, and z4 values and the x and y values. The calculating procedure is described below.

A rate of change on x ofs_x is evaluated from x1 and x2 in FIG. 9 according to equation (2).

[Eq. 2]

$$ofs\_x = (x-x1)/(x2-x1) \quad (2)$$

In the same manner, a rate of change on y ofs_y is evaluated from y1 and y2 in FIG. 9 according to equation (3).

[Eq. 3]

$$ofs\_y = (y-y1)/(y2-y1) \quad (3)$$

A calculation result z can be obtained here from equations (4–1), (4–2), and (4–3).

[Eq. 4]

$$z\_r1 = z1 + (z2-z1) \times ofs\_x \quad (4\text{--}1)$$

$$z\_,2 = z3 + (z4-z3) \times ofs\_y \quad (5)$$

$$z = z\_,1 + (z\_,2 - z\_,1) \times ofs\_y \quad (6)$$

Generally, when a calculation is made, it is often the case that a calculation result possible range is given as a specification and that a calculation result is unnecessary outside the given range. In such instance, the above conventional art needs to store only the calculation result possible range in a memory element. If so, it often results in a complicated structure of a stored table and the complexity causes a problem that a table write/read logic of the memory element becomes complicated.

It is assumed here that the result z possible range is specified to be 60 to 150 in FIG. 8, for example. A region actually stored in the memory in this instance is shown in FIG. 10. In FIG. 10, the region corresponding to the specification range (60 to 150) of z in FIG. 8 is half-tone dot meshed. The meshed region has a complicated shape and therefore the write/read logic for the memory is complicated.

SUMMARY OF THE INVENTION

In view of the above problem of the conventional art, the present invention has been provided. It is an object of the present invention to provide a new and improved calculating apparatus, which facilitates a structure of table data stored in a memory to make a memory write/read logic easy and which is capable of reducing a storage area, its method, and their related technologies.

The memory stores data in a table format for referring to a value of a variable x by using values of a variable y and a solution z.

A calculating section inputs a given value x_in of the variable x and a given value y_in of the variable y, reads out two values y_a and y_b of the stored variable y corresponding to the given value y_in of the input variable y from the memory, reads out two values x_aa and x_ab of the stored variable x corresponding to the given value x_in of the input variable x from the memory in a line corresponding to the value y_a of the table-format data, reads out two values x_ba and x_bb of the stored variable x corresponding to the given value x in of the input variable x in a line corresponding to the value y_b of the table-format data, and calculates the solution z corresponding to the given value x_in of the input variable x and the given value y_in of the input variable y in an interpolation by using the given value x_in of the input variable x, the given value y_in of the input variable y, and the read values y_a, y_b, x_aa, x_ab, x_ba, and x_bb.

According to the above calculating apparatus, the memory is used for storing table-format data for referencing a value of the variable x by using a value of the variable y and a value of the solution z, by which a structure of the table-format data can be simplified even if a possible range of the solution z is given in the specification. Thus, the memory write/read logic can be simplified.

Regarding the table-format data, preferably in a region requiring a high-precision calculation, the variable y and the solution z are given at more precise intervals than in a region not requiring a high-precision calculation, so that the corresponding variable x is given at more precise intervals. In the region requiring a high precision, the solution z of a high precision can be obtained. Furthermore, rough settings for a region other than the region requiring a high precision are useful to save a memory capacity.

In addition, preferably the table-format data can be obtained directly from an experimental result. If the present invention is applied to a general sensor application product, an actual calculation result is sometimes hard to find only from a theoretical formula due to various factors such as errors, power supply characteristics, or temperature characteristics in elements of an external circuit and a sensor. At this point, if the table-format data is directly found out of the experimental result, the experimental result can be directly reflected on it without a theoretical formula and a practical solution can be obtained.

Furthermore, according to a second aspect of the present invention, there is provided a method of calculating a solution z by using a variable x and a variable y, comprising the following steps of:
(1) Storing table-format data for referencing a value of the variable x into a memory by using the value of the variable y and the value of the solution z
(2) Inputting a given value x_in of the variable x and a given value y_in of the variable y
(3) Reading two values y_a and y_b of the stored variable y corresponding to the given value y_in of the input variable y from the memory
(4) Reading out two values x_aa and x_ab of the stored variable x corresponding to the given value x in of the input variable x in a line corresponding to the value y_a of the table data
(5) Reading out two values x_ba and x_bb of the stored variable x corresponding to the given value x_in of the input variable x in a line corresponding to the value y_b of the table data
(6) Calculating a solution z corresponding to the given value x_in of the input variable x and to the given value y_in of the input variable y in an interpolation by using the given value x_in of the input variable x, the given value y_in of the input variable y, and the read values y_a, y_b, x_aa, x_ab, x_ba, and x_bb According to this calculating method, an optimum solution z can be obtained even if the table-format data for referencing the value of the variable x is stored in the memory by using the value of the variable y and the value of the solution z. Then, even if a possible range of the solution z is specified in the specification, a structure of the table-format data can be simplified. Thus, the memory write/read logic can be simplified.

Furthermore, according to another aspect of the present invention, there is provided a program for causing a computer to function as the above calculating apparatus. Still further, according to the present invention, there is provided a recording medium, which contains a record of this program and can be read by the computer.

BRIEF DESCRIPTION OF THE DRAWINGS

The objects and features of this invention will become more apparent from a consideration of the following detailed description and the drawing in which:

FIG. 2 is an explanatory diagram showing a table for evaluating a thermocouple output (x) from an ambient temperature (y) and a thermocouple input temperature (z) according to a first embodiment of the present invention;

FIG. 6 is an explanatory diagram showing a table for evaluating a thermocouple output (x) from an ambient temperature (y) and a thermocouple input temperature (z) according to a second embodiment of the present invention;

FIG. 8 is an explanatory diagram showing a table for evaluating a thermocouple input temperature (z) from a thermocouple output (x) and an ambient temperature (y) of a conventional art;

FIG. 9 is an explanatory diagram showing a conventional calculating method; and FIG. 10 is an explanatory diagram showing a table for evaluating the thermocouple input temperature (z) from the thermocouple output (x) and the ambient temperature (y) of the conventional art.

DETAILED DESCRIPTION OF THE PREFERRED EMBODIMENTS

Figure 1:
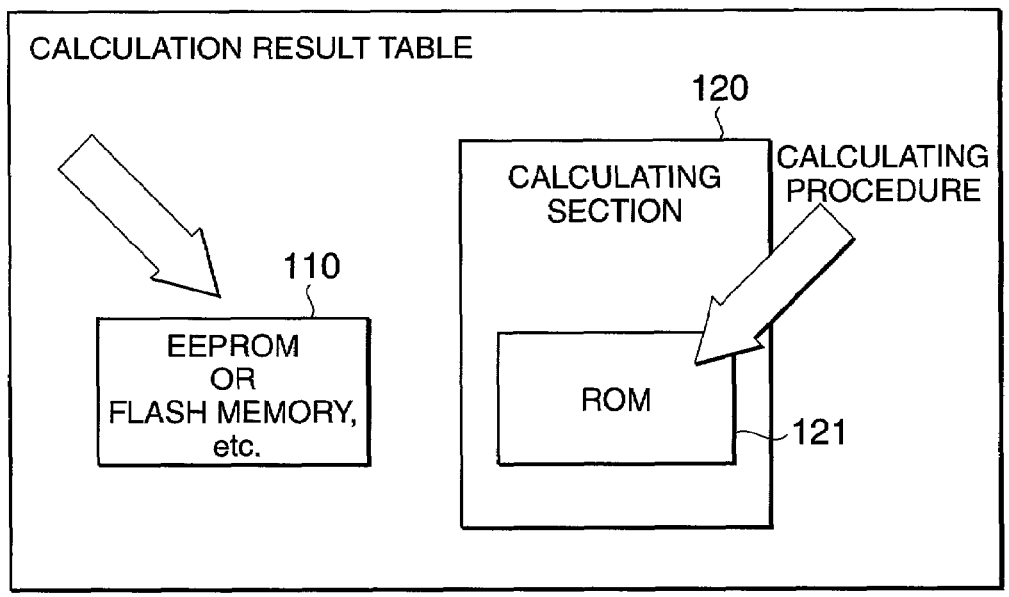
FIG. 1 is an explanatory diagram showing a system configuration of a calculating apparatus according to this embodiment of the present invention.

The preferred embodiments of a calculating apparatus, a calculating method, and their related technologies according to the present invention will now be described in detail hereinafter with reference to the accompanying drawings. In this specification and drawings, elements having substantially identical functions are designated by identical reference numerals to omit redundant explanation.

[First Preferred Embodiment]

First, a calculating apparatus according to this embodiment will now be described by referring to FIG. 1. Referring to FIG. 1, there is shown an explanatory diagram of a system configuration of a calculating apparatus according to this embodiment. The calculating apparatus is for use in calculating a solution z by using a variable x and a variable y; this embodiment is concretely described by giving an example that a thermocouple input temperature z is obtained from a thermocouple output x and an ambient temperature y.

As shown in FIG. 1, a calculating apparatus 100 comprises a memory 110 including an EEPROM or a flash memory and a calculating section 120. The calculating section 120 is capable of appropriately referencing table-format data, which is described later and stored in the memory 110.

(Memory 110)

The memory 110 contains table-format data (see FIG. 2) for referencing the value of the thermocouple output x from the ambient temperature y and the thermocouple input temperature z. The following equation (5) is for use in calculating the value of the thermocouple output x from the value of the ambient temperature y and the value of the thermocouple input temperature z. The equation (5) is equivalent to the equation (1) shown in the above description of the conventional art.

[Eq. 5]

$$x=((z+273.15)^4-(y+273.15)^4)/c \quad (5)$$

where $c=1.0\times10^{11}$

The table data shown in FIG. 2 includes values of the thermocouple output x calculated by giving a discrete value to the ambient temperature y and the thermocouple input temperature z in the equation (5). The ambient temperature y is given a discrete value incremented by 10° C. within a range of −20° C. to 160° C. and the thermocouple input temperature is given a discrete value incremented by 10° C. within a range of 60° C. to 150° C.

The table data shown in FIG. 2 has an axis of a table data shown in FIG. 10 converted from (x and y) to (z and y). This causes the memory 110 to be stored with the entire table data shown in FIG. 2 instead of the extracted region (the meshed region) of the table data in FIG. 10.

The table data shown in FIG. 2 can also be calculated outside the calculating apparatus 100 and then stored in the memory 110 or be calculated in the calculating section 120 inside the calculating apparatus 100 and then sent to the memory 110.

(Calculating Section 120)

The calculating section 120 includes a ROM 121 for storing a procedure for calculating the thermocouple input temperature z. This ROM 121 is stored with the following equations (6) to (11) with being programmed.

[Eq. 6]

$$ofs\_y=(y\_in-y\_a)/(y\_b-y\_a) \quad (6)$$

[Eq. 7]

$$ofs\_xa=(x\_in-x\_aa)/(x\_ab-x\_aa) \quad (7)$$

[Eq. 8]

$$ofs\_xb=(x\_in-x\_ba)/(x\_bb-x\_ba) \quad (8)$$

[Eq. 9]

$$iofs\_xa=i\_xa+ofs\_xa \quad (9\text{-}1)$$

$$iofs\_xb=i\_xb+ofs\_xb \quad (9\text{-}2)$$

[Eq. 10]

$$iofs\_x=iofs\_xa+(iofs\_xb-iofs\_xa)\times ofs\_y \quad (10)$$

[Eq. 11]

$$ofs\_x=iofs\_x-i\_x1 \quad (11\text{-}1)$$

$$z=z\_1+(z\_2-z\_1)\times ofs\_x \quad (11\text{-}2)$$

The calculating apparatus 100 has the above configuration.

Figure 3:
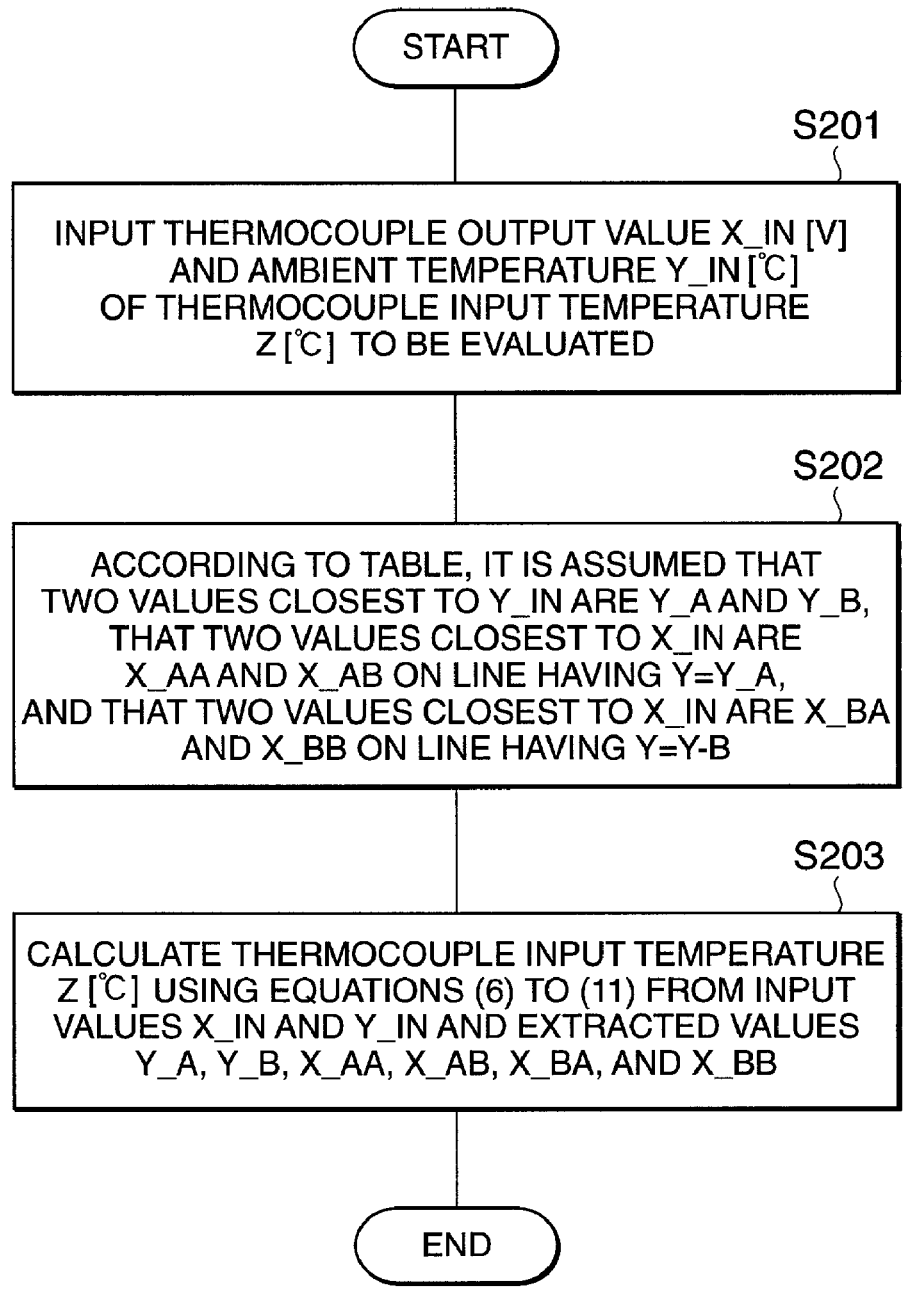
FIG. 3 is a flowchart showing a calculating method according to the embodiment of the present invention.
Figure 4:
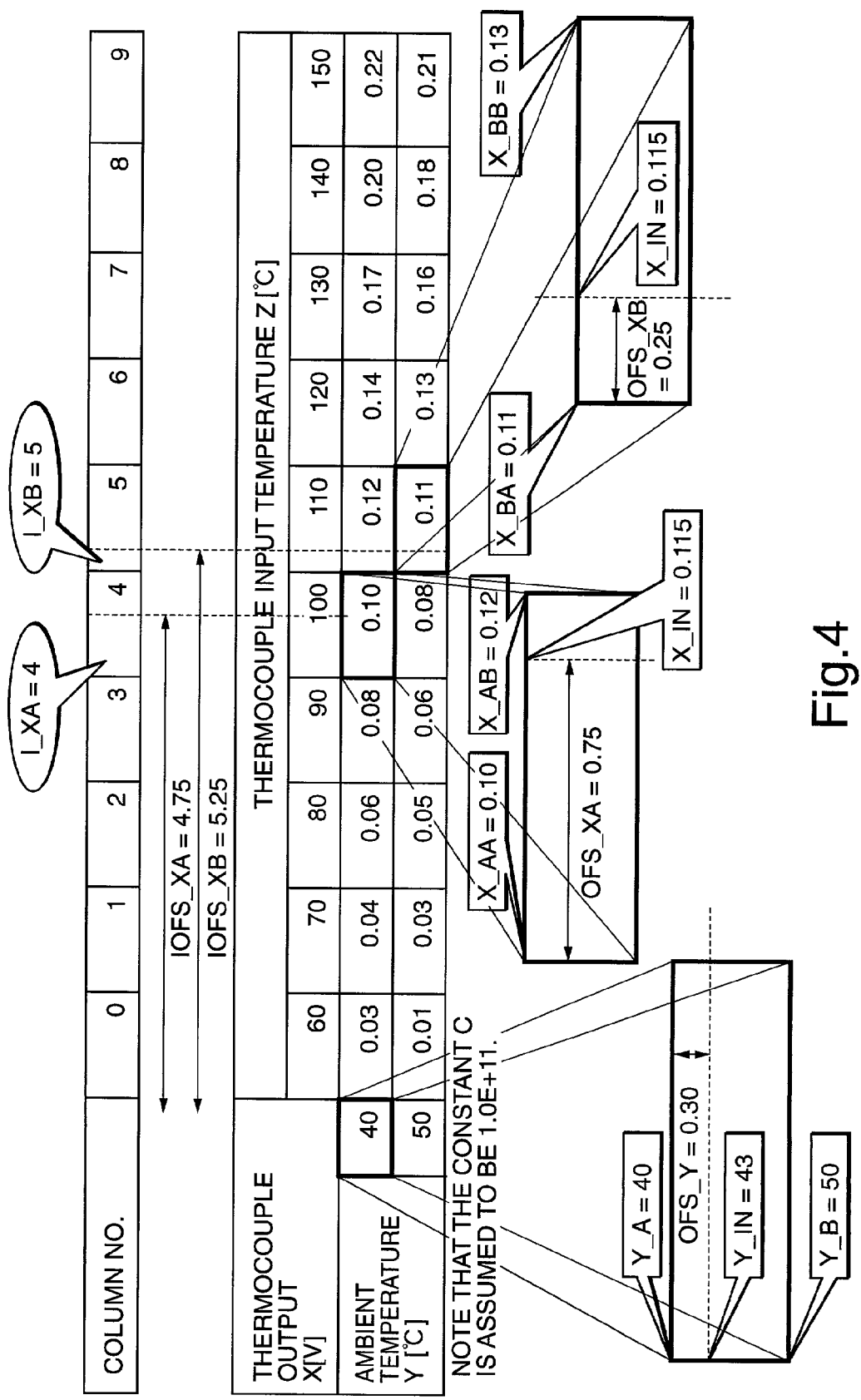
FIG. 4 is an explanatory diagram showing a calculating method according to the embodiment of the present invention.
Figure 5:
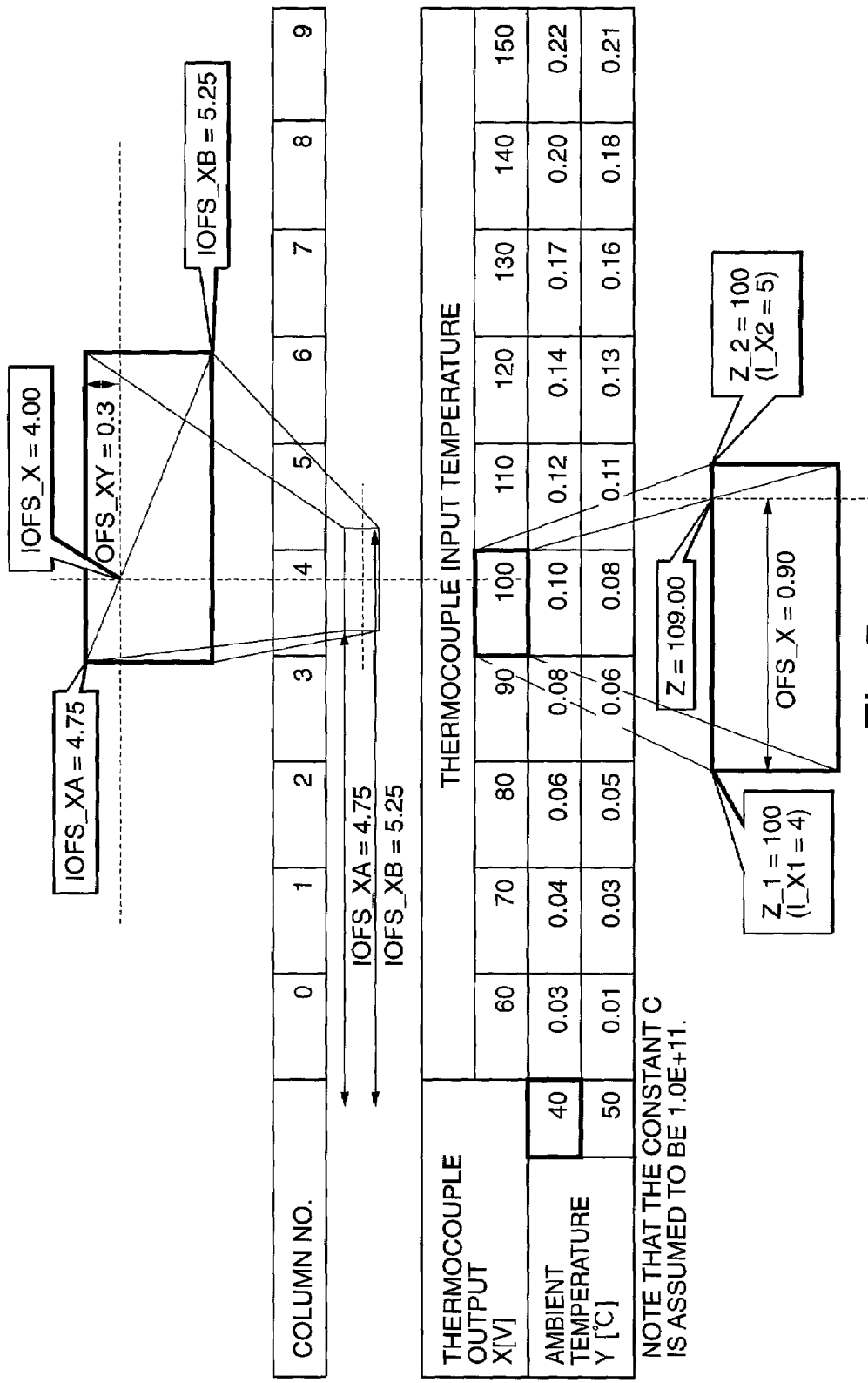
FIG. 5 is an explanatory diagram showing a calculating method according to the embodiment of the present invention.

Subsequently, the calculating method according to this embodiment will be described by referring to FIG. 3 to FIG. 5. Referring to FIG. 3, there is shown a flowchart of the calculating method according to this embodiment. Referring to FIG. 4 and FIG. 5, there are shown explanatory diagrams of the calculating method according to this embodiment of the present invention. The method is described here as an embodiment for evaluating the thermocouple input temperature where the thermocouple output is 0.115 [V] and the ambient temperature is 43 [° C.], in other words, for evaluating z where x=0.115 and y=43.

(Step S201)

First, the calculating section 102 receives an input of the thermocouple output potential x (=x_in=0.115) and the ambient temperature y (=y_in=43) corresponding to the thermocouple input temperature z to be evaluated.

(Step S202)

Next, the calculating section 120 extracts two values y_a and y_b closest to the input ambient temperature y_in from the memory 110 in which the table data shown in FIG. 2 is stored. In other words, the value y_a is the maximum value satisfying y_a≦y_in and the value y_b is the minimum value satisfying y_in<y_b. Extracting the two values y_a and y_b closest to the input thermocouple output potential y_in is carried out in order to minimize an error of the thermocouple input temperature z to be evaluated. In this embodiment, the calculating section 120 extracts 40 as a value of y_a and 50 as a value of y_b from the memory 110.

Subsequently, the calculating section 120 extracts two values x_aa and x_ab closest to the input thermocouple output x_in in a line having y=y_a=40 of the table data shown in FIG. 2. In other words, the value x_aa is the maximum value satisfying x_aa≦x_in and the value x_ab is the minimum value satisfying x_in<x_ab. Extracting the two values x_aa and x_ab closest to the input thermocouple output x_in is carried out in order to minimize an error of the thermocouple input temperature z to be evaluated. In this embodiment, the calculating section 120 extracts 0.10 as a value of x_aa and 0.12 as a value of x_ab from the memory 110.

Similarly, the calculating section 120 extracts two values x_ba an x_bb closest to the input thermocouple output x_in in a line having y=y_b=50 of table data shown in FIG. 2. In other words, the value x_ba is the maximum value satisfying x_ba≦xin and the value x_bb is the minimum value satisfying x_in<x_bb. Extracting the two values x_ba and x_bb closest to the input thermocouple output x_in is carried out in order to minimize an error of the thermocouple input temperature z to be evaluated. In this embodiment, the calculating section 120 extracts 0.11 as a value of x_ba and 0.13 as a value of x bb from the memory 110.

(Step S203)

The thermocouple input temperature z is calculated from the input values x_in and y_in and the extracted values y_a, y_b, x_aa, x_ab, x_ba, and x_bb described hereinabove. The following calculating procedure is described below by referring to FIG. 4.

First, the calculating section 120 makes a calculation of the equation (6) by using the input ambient temperature y_in (=43) and the extracted ambient temperatures y_a (=40) and y_b (=50) to evaluate a rate of change ofs_y (=0.3) of the ambient temperature.

Next, the calculating section 120 makes a calculation of the equation (7) by using the input thermocouple output x_in (=0.115) and the extracted thermocouple output x_aa (=0.10) and x_ab (=0.12) to evaluate a rate of change of x_xa (=0.75) of the thermocouple output. In the following description, a column of x_aa of the table data shown in FIG. 2 is assumed to be the (i_xa)th column (=the fourth column)

Similarly, the calculating section 120 makes a calculation of the equation (8) by using the input thermocouple output x_in (=0.115) and the extracted thermocouple output x_ba (=0.11) and x_bb (=0.13) to evaluate a rage of change ofs_xb (=0.25) of the thermocouple output. In the following description, a column of x_ba of the table data shown in FIG. 2 is assumed to be the (i_xb)th column (=the fifth column).

Next, the calculating section 120 makes calculations of the equations (9–1) and (9–2) by using rates of change ofs_xa (=0.75) and ofs_sb (=0.25) of the thermocouple output and the column numbers i_xa (=4) and i_xb (=5) to evaluate rates of change iofs_xa (=4.75) and ifos_xb (=5.25).

A subsequent calculating method is described below by referring to FIG. 5.

The calculating section 120 makes a calculation of the equation (10) by using rates of change iofs_xa (=4.75) and ifos_xb (=5.25) and the column numbers i_xa (=4) and i_xb (=5) to evaluate a rate of change iofs_x (=4.9).

Next, the calculating section 120 extracts two column numbers i_x1 and i_x2 closest to a rate of change iofs_x (=4.9). In other words, the column number i_x1 is the maximum integer satisfying i_x1≦iofs_x and the column number i_x2 is the minimum integer satisfying iofs_x≦i_x2. In this embodiment, they are i_x1=4 and i_x2=5.

Subsequently, the calculating section 120 makes calculations of the equations (11–1) and (11–2) by using the thermocouple input temperatures z_1 (=100) and z_2 (=110) of the (i_x1)th column and the (i_x2)th column to evaluate the thermocouple input temperature z (=109).

As set forth hereinabove, according to this embodiment, the memory 110 is stored with table-format data (see FIG. 2) for referencing a value of the variable x by using a value of the variable y and a value of the solution z, by which a structure of the table-format data can be simplified even if a possible range of the solution z is specified in the specification. Thus, the write/read logic of the memory 110 can be simplified.

The calculating apparatus described hereinabove can be configured as dedicated hardware. In addition, a program can be installed in a computer to execute the function of the calculating apparatus. In this instance, the program can be distributed in a form of a corporeal object by recording it in a recording medium such as a CD-ROM, for example.

[Second Preferred Embodiment]

Referring to FIG. 6, there is shown an explanatory diagram showing table data according to a second embodiment of the present invention.

The table data stored in the memory 110 in this embodiment is precise only in a region requiring a high-precision calculation as shown in FIG. 6. In other words, in the region requiring a high-precision calculation, the ambient temperature y and the thermocouple input temperature z are given at more precise intervals than in a region not requiring a high-precision calculation, so that the corresponding thermocouple output x is given at more precise intervals. The table data is stored in the memory 110 in this format.

According to the second embodiment of the present invention, in the region requiring a high precision, a high-precision thermocouple input temperature can be further obtained in addition to the effect of the first embodiment. Furthermore, rough settings for a region other than the region requiring a high precision are useful to save a capacity of the memory 110.

[Third Preferred Embodiment]

While the table data shown in FIG. 2 or FIG. 6 is generated by using the equation (5) which is a theoretical formula in the first and second embodiments, this embodiment is characterized by that table data is obtained directly from an experimental result instead of the theoretical formula.

Figure 7:
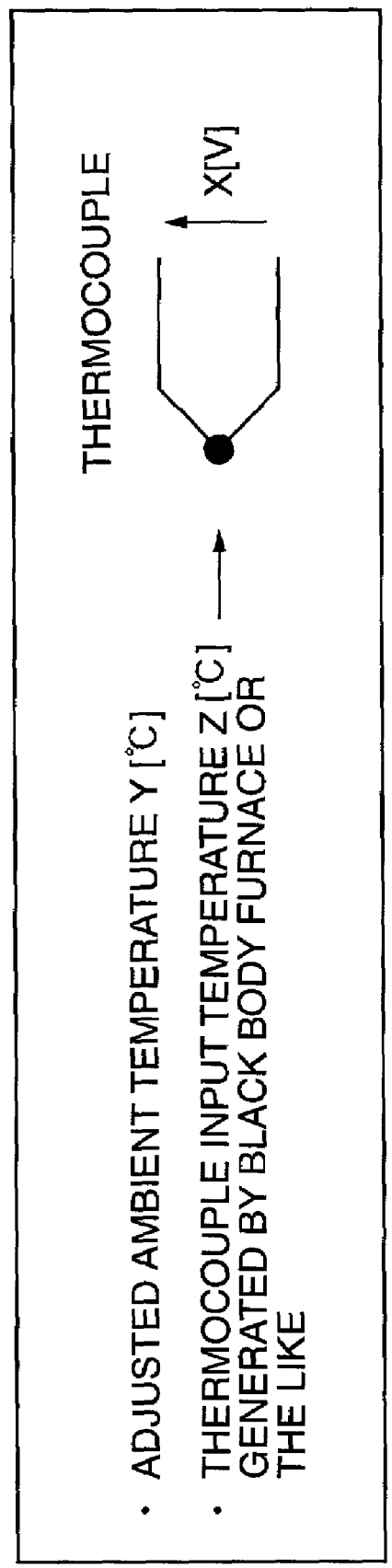
FIG. 7 is an explanatory diagram according to a third embodiment of the present invention.

For example, as shown in FIG. 7, the ambient temperature y [° C.] and the thermocouple input temperature z [° C.] are directly given externally for an experiment of measuring the thermocouple output x [V]. Then, values of the ambient temperature y [° C.] and the thermocouple input temperature z [° C.] are recorded, by which it becomes possible to obtain the same data as table data shown in FIG. 2 or FIG. 6 as an experimental result.

In a general sensor application product, it is hard to evaluate an actual calculation result only from a theoretical formula due to various factors such as errors, power supply characteristics, or temperature characteristics in elements of an external circuit and a sensor. At this point, according to this embodiment, the experimental result is directly reflected on the table without a theoretical formula, by which a practical solution can be obtained.

While the calculating apparatus, the calculating method, and their related technologies according to the present invention have been described hereinabove in connection with certain preferred embodiments by referring to accompanying drawings, it is to be understood that the present invention is not limited to those specific embodiments. Apparently those skilled in the art could easily consider that various changes and modifications may be made within the technical concepts as set forth in claims and naturally it will be understood that these changes and modifications fall within the technical scope of the present invention.

For example, while the table of calculations of the thermocouple output x has been described with the ambient temperature y and the thermocouple input temperature z as axes in the above embodiment, the present invention is not limited thereto. The same calculating method is possible by using a table of ambient temperature calculations with the thermocouple output x and the thermocouple input temperature z as axes. More generally speaking, this invention is applicable to all kinds of technologies requiring a plurality of input variables to be given for finding a calculation result.

As set forth hereinabove, according to the present invention, the structure of the table stored in the memory is simplified and therefore the write/read logic of the memory can be simplified.

What is claimed is:

1. A calculating apparatus for calculating a solution z by using a variable x and a variable y, comprising:
 a memory for storing table-format data for referencing a value of said variable x by using a value of said variable $y_{13}$ and a value of said solution z; and
 a calculating section, which:
 inputs a given value $x_{13}$ in of said variable x and a given value $y_{13}$ in of said variable y and reads out two values $y_{13}$ a and $y_{13}$ b of said stored variable $y_{13}$ corresponding to the given value $y_{13}$ in of said input variable $y_{13}$ from said memory;
 reads out two values $x_{13}$ aa and $x_{13}$ ab of said stored variable x corresponding to the given value $x_{13}$ in of said input variable x from said memory in a line corresponding to said value $y_{13}$ a of said table-format data;

reads out two values $x_{13}$ ba and $x_{13}$ bb of said stored variable x corresponding to the given value $x_{13}$ in of said input variable x from said memory in a line corresponding to said value $y_{13}$ b of said table-format data; and calculates the solution z corresponding to the given value $x_{13}$ in of said input variable x and the given value $y_{13}$ in of said input variable $y_{13}$ in an interpolation by using the given value $x_{13}$ in of said input variable x, the given value $y_{13}$ in of said input variable y, and the read values $y_{13}$ a, $y_{13}$ b, $x_{13}$ aa, $x_{13}$ ab, $x_{13}$ ba, and $x_{13}$ bb.

2. The apparatus according to claim 1, wherein said table-format data has values of said variable $y_{13}$ and said solution z given at more precise intervals in a region requiring a high-precision calculation than in a region not requiring a high-precision calculation, so that the corresponding variable x is given at more precise intervals.

3. The apparatus according to claim 1, wherein said table-format data is obtained directly from an experimental result.

* * * * *